United States Patent
Camp et al.

(10) Patent No.: US 10,733,069 B2
(45) Date of Patent: *Aug. 4, 2020

(54) PAGE RETIREMENT IN A NAND FLASH MEMORY SYSTEM

(71) Applicant: INTERNATIONAL BUSINESS MACHINES CORPORATION, Armonk, NY (US)

(72) Inventors: Charles J. Camp, Sugar Land, TX (US); Ioannis Koltsidas, Zurich (CH); Roman A. Pletka, Zurich (CH); Andrew D. Walls, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 319 days.

This patent is subject to a terminal disclaimer.

(21) Appl. No.: 15/824,419

(22) Filed: Nov. 28, 2017

(65) Prior Publication Data

US 2019/0163592 A1    May 30, 2019
US 2020/0057702 A9    Feb. 20, 2020

Related U.S. Application Data

(63) Continuation of application No. 15/041,246, filed on Feb. 11, 2016, now Pat. No. 9,952,795, which is a
(Continued)

(51) Int. Cl.
*G06F 11/00* (2006.01)
*G06F 11/20* (2006.01)
(Continued)

(52) U.S. Cl.
CPC ........ *G06F 11/2094* (2013.01); *G06F 3/0619* (2013.01); *G06F 3/0653* (2013.01);
(Continued)

(58) Field of Classification Search
CPC ............ G06F 11/0727; G06F 11/1008; G06F 11/1044; G06F 12/0246; G06F 2212/7204;
(Continued)

(56) References Cited

U.S. PATENT DOCUMENTS 6,000,006 A    12/1999    Bruce et al.
7,804,718 B2   9/2010     Kim
(Continued)

OTHER PUBLICATIONS

Grupp, Laura M., "Characterizing Flash Memory: Anomalies, Observations, and Applications", MICRO'09 New York, Dec. 12-16, 2009.
(Continued)

*Primary Examiner* — Marc Duncan
(74) *Attorney, Agent, or Firm* — Stosch Sabo; Brian F. Russell

(57) ABSTRACT

In a data storage system including a non-volatile random access memory (NVRAM) array, a page is a smallest granularity of the NVRAM array that can be accessed by read and write operations, and a memory block containing multiple pages is a smallest granularity of the NVRAM array that can be erased. Data are stored in the NVRAM array in page stripes distributed across multiple memory blocks. In response to detection of an error in a particular page of a particular block of the NVRAM array, only the particular page of the particular block is retired, such that at least two of the multiple memory blocks across which a particular one of the page stripes is distributed include differing numbers of active (non-retired) pages.

3 Claims, 7 Drawing Sheets

Related U.S. Application Data continuation of application No. 14/096,823, filed on Dec. 4, 2013, now Pat. No. 9,274,882.

(51) Int. Cl.
| | | |
|---|---|---|
| *G06F 3/06* | (2006.01) | |
| *G06F 11/10* | (2006.01) | |
| *G11C 29/52* | (2006.01) | |
| *G11C 29/04* | (2006.01) | |

(52) U.S. Cl.
CPC .......... *G06F 3/0655* (2013.01); *G06F 3/0688* (2013.01); *G06F 11/1004* (2013.01); *G06F 11/108* (2013.01); *G06F 11/1012* (2013.01); *G06F 11/1068* (2013.01); *G11C 29/52* (2013.01); *G06F 2201/805* (2013.01); *G06F 2201/82* (2013.01); *G11C 2029/0409* (2013.01)

(58) Field of Classification Search
CPC ..... G06F 2212/7205; G06F 2212/7206; G11B 2020/1826; G11B 20/18; G11B 19/048
See application file for complete search history.

(56) References Cited

U.S. PATENT DOCUMENTS

| | | |
|---|---|---|
| 7,856,528 B1 | 12/2010 | Frost et al. |
| 7,941,696 B2 | 5/2011 | Frost et al. |
| 8,176,284 B2 | 5/2012 | Frost et al. |
| 8,711,619 B2 | 4/2014 | Patapoutian et al. |
| 8,972,824 B1 | 3/2015 | Northcott et al. |
| 9,026,867 B1 | 5/2015 | Northcott et al. |
| 9,047,214 B1 | 6/2015 | Northcott |
| 9,251,019 B2 | 2/2016 | Losh et al. |
| 9,274,882 B2 * | 3/2016 | Camp ................. G06F 11/1012 |
| 9,304,853 B2 | 4/2016 | Thatcher et al. |
| 9,952,795 B2 * | 4/2018 | Camp ................. G06F 11/1012 |
| 2012/0047409 A1 | 2/2012 | Post et al. |
| 2013/0238839 A1 | 9/2013 | Weingerten et al. |
| 2014/0164824 A1 | 6/2014 | Reche et al. |
| 2015/0143054 A1 | 5/2015 | Ackaret et al. |
| 2015/0149818 A1 | 5/2015 | Kalavade et al. |

OTHER PUBLICATIONS

Hutsell, Woody, "An In-depth Look at the RamSan-620 Flash Solid State Disk", Texas Memory Systems, Jul. 2009.
Ferreira, Kurt B., "Evaluating Operating System Vulnerability to Memory Errors", ROSS '12 Venice, Italy, Jun. 29, 2012.
Camp, Charles J., U.S. Appl. No: 14/096,823, filed Dec. 4, 2013, Non-Final Office Action dated Jul. 9, 2015.
Camp, Charles J., U.S. Appl. No. 14/096,823, filed Dec. 4, 2013, Notice of Allowance dated Nov. 2, 2015.
Camp, Charles J., U.S. Appl. No. 15/041,246, filed Feb. 11, 2016, Non-Final Office Action dated Aug. 30, 2017.

* cited by examiner

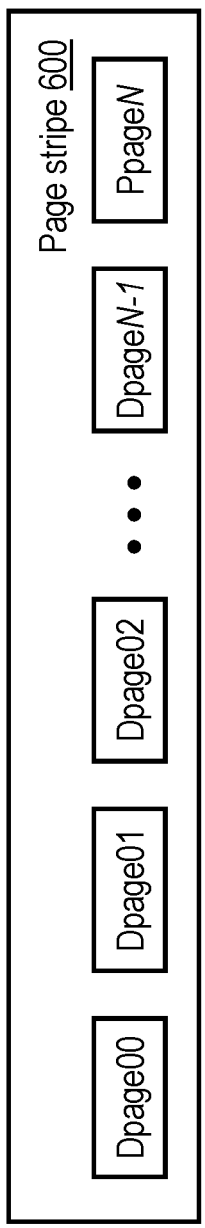
Fig. 6
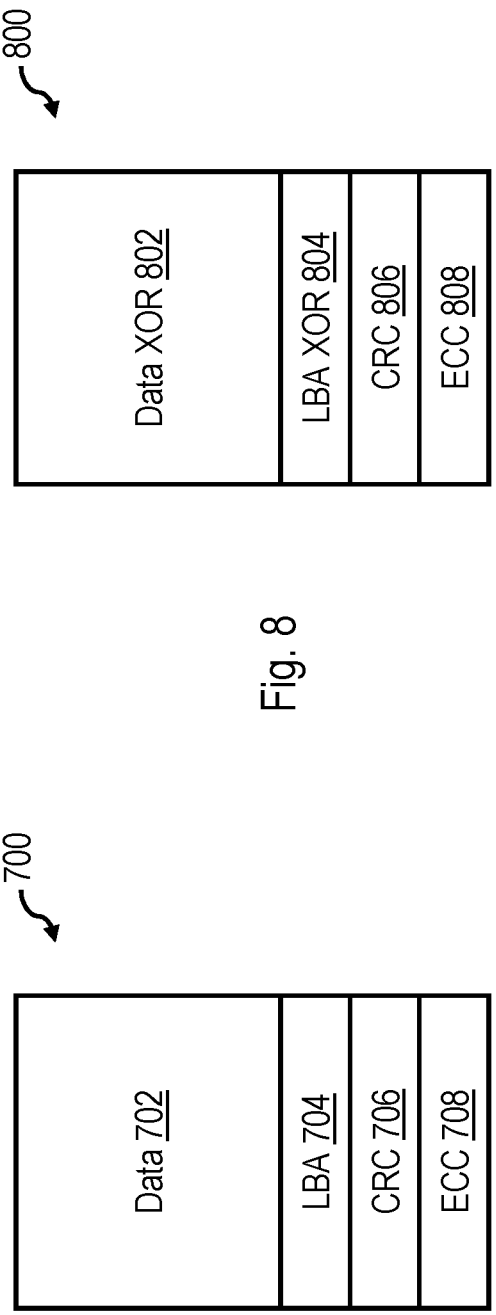
Fig. 8
Fig. 7

PAGE RETIREMENT IN A NAND FLASH MEMORY SYSTEM

BACKGROUND OF THE INVENTION

This disclosure relates to data processing and storage, and more specifically, to improving the ability of a data storage system to efficiently perform page retirement.

In certain data storage systems, data is stored in multiple storage devices. For example, in some such systems, multiple individual hard disks or memory chips are used to store data, and the data stored in one or more of the storage devices is associated with data stored in other storage devices in such a manner that data errors in one or more storage devices can be detected and possibly corrected. One such approach is to store a given quantity of data across multiple storage locations by dividing the quantity of data into portions of equal size—the individual portions sometimes being referred to as "data pages"—and then storing the data pages in multiple storage locations such that one data page is stored in each of multiple storage devices. In connection with this approach, a further storage device may be used to store a page of data protection information, where a given page of data protection information is associated with a specific set of data pages stored in the multiple storage locations. In some instances, the set of data pages in the multiple locations that is used to store associated data is referred to as a "data stripe" or "page stripe."

In addition to the data protection information for each data stripe, individual data pages may also be protected by an error correcting code (ECC) that may be utilized to detect errors and to correct some number of errors within the page. ECC protection is provided on a certain code word whose size is often referred to as the codeword (or block) length. There may be multiple codewords within a data page. At some number or occurrence of errors, the data storage system may determine to withdraw from use (retire) portions of the data storage that are the source of errors. In data storage systems employing NAND flash memory, a data page is the smallest granule of storage that can be accessed by read and write operations, and a block (or erase block), which contains many pages, is the smallest granule of storage that can be erased. Consequently, it is conventional for a data storage system to retire an entire erase block from use in response to an ECC failure of even a codeword on a single page within the erase block.

The present disclosure recognizes that this conventional block retirement policy is over-inclusive and can unnecessarily shorten the life of a NAND flash storage device because the NAND flash storage device will itself be retired when a threshold number of its erase blocks are retired.

BRIEF SUMMARY

In a data storage system including a non-volatile random access memory (NVRAM) array (e.g., a NAND flash memory array), a page is the smallest granularity of the NVRAM array that can be accessed by read and write operations, and a memory block containing multiple pages is a smallest granularity of the NVRAM array that can be erased. Data are stored in the NVRAM array in page stripes distributed across multiple memory blocks. In response to detection of an uncorrectable error in a particular code word of a particular page of a particular block of the NVRAM array, only the particular page of the particular block is retired, such that at least two of the multiple memory blocks across which a particular one of the page stripes is distributed include differing numbers of active (non-retired) pages.

BRIEF DESCRIPTION OF THE SEVERAL VIEWS OF THE DRAWINGS

FIG. 6 depicts an exemplary implementation of a page stripes in accordance with the present disclosure;

FIG. 7 illustrates an exemplary data page in accordance with the present disclosure;

FIG. 8 depicts an exemplary data protection page in accordance with the present disclosure;

DETAILED DESCRIPTION

Figure 1:
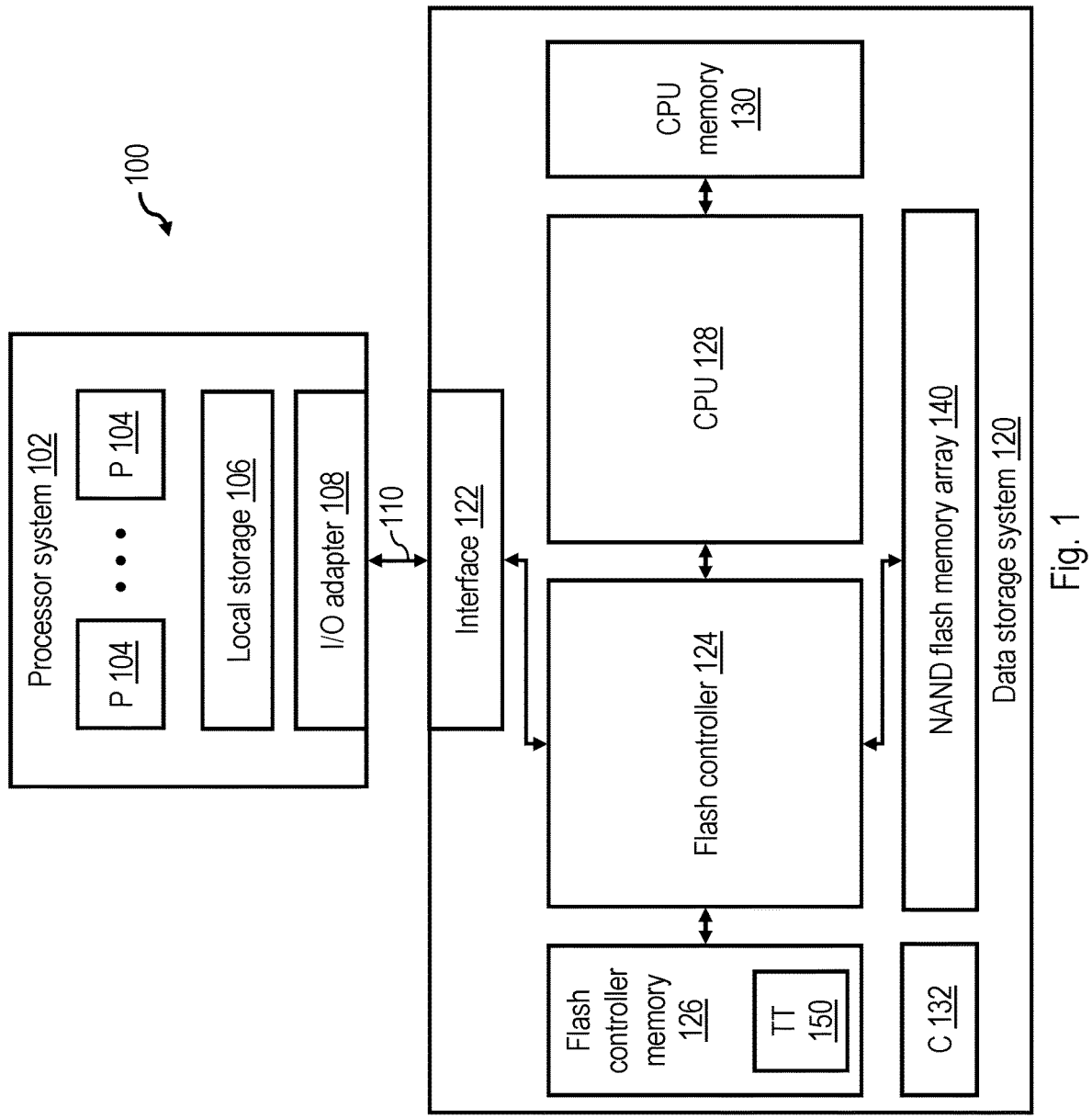
FIG. 1 is a high level block diagram of a data processing environment in accordance with one embodiment.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

With reference now to the figures and with particular reference to FIG. 1, there is illustrated a high level block diagram of an exemplary data processing environment 100 including a data storage system that retires NAND flash memory on a page-by-page basis rather than a block-by-block basis, as described further herein. As shown, data processing environment 100 includes at least one processor system 102 having one or more processors 104 that process instructions and data. Processor system 102 may additionally include local storage 106 (e.g., dynamic random access memory (DRAM) or disks) that may store program code, operands and/or execution results of the processing performed by processor(s) 104. In various embodiments, processor system 102 can be, for example, a mobile computing device (such as a smartphone or tablet), a laptop or desktop personal computer system, a server computer system (such as one of the POWER series available from International Business Machines Corporation), or a mainframe computer system. It can also be an embedded processor system using various processors such as ARM, PowerPC, Intel X86, or any other processor combined with memory caches, memory controllers, local storage, I/O bus hubs, etc.

Processor system 102 further includes an input/output (I/O) adapter 108 that is coupled directly (i.e., without any intervening device) or indirectly (i.e., through at least one intermediate device) to a data storage system 120 via an I/O channel 110. In various embodiments, I/O channel may employ any one or a combination of known or future developed communication protocols, including, for example, Fibre Channel (FC), FC over Ethernet (FCoE), Internet Small Computer System Interface (iSCSI), Transport Control Protocol/Internet Protocol (TCP/IP), Peripheral Component Interconnect Express (PCIe), etc. I/O operations (IOPs) communicated via I/O channel 110 include read IOPs by which processor system 102 requests data from data storage system 120 and write IOPs by which processor system 102 requests storage of data in data storage system 120.

In the illustrated embodiment, data storage system 120 includes an interface 122 through which data storage system 120 receives and responds to IOPs 102 via I/O channel 110. Interface 122 is coupled to a flash controller 124 (e.g., an Application Specific Integrated Circuit (ASIC) or Field Programmable Gate Array (FPGA)) having an associated flash controller memory 126 (e.g., Dynamic Random Access Memory (DRAM)). Flash controller 124 is additionally coupled to a CPU 128 having an associated CPU memory 130 (e.g., DRAM) and further coupled to a NAND flash memory array 140. In embodiments in which flash controller 124 is implemented with an FPGA, CPU 128 may program and configure flash controller 124 during start-up of data storage system 120. After startup, in general operation flash controller 124 receives read and write IOPs via I/O channel 110 and interface 122 to read data stored in NAND flash memory array 140 and/or to store data in NAND flash memory array 140. Flash controller 124 services these IOPs, for example, by accessing NAND flash memory array 140 to read or write the requested data from or into NAND flash memory array 140 or by accessing a memory cache (not illustrated) associated with NAND flash memory array 140.

Flash controller 124 implements a flash translation layer (FTL) that provides logical-to-physical address translation to enable access to specific memory locations within NAND flash memory array 140. In general, an IOP received by flash controller 124 from a host device, such as a processor system 102, contains the logical block address (LBA) at which the data is to be accessed (read or written) and, if a write IOP, the write data to be stored to data storage system 120. The IOP may also specify the amount (or size) of the data to be accessed. Other information may also be communicated depending on the protocol and features supported by data storage system 120. As noted above, NAND flash memory, such as that employed in NAND flash memory array 140, is constrained by its construction such that the smallest granule of data that can be accessed by a read or write IOP is fixed at the size of a single flash memory page, for example, 16 kilobytes (kB). The LBA provided by the host device thus corresponds to a page within a logical address space. The flash translation layer translates this LBA into a physical address assigned to a corresponding physical location in NAND flash memory array 140. Flash controller 124 may perform address translation and/or store mappings between logical and physical addresses in a logical-to-physical translation data structure, such as translation table 150, which may conveniently be stored in flash controller memory 126.

In some embodiments, the components of data storage system 120 are mounted to the same printed circuit board, for example, using surface mounting techniques, through-hole techniques, through the use of sockets and socket-mounts and/or other mounting techniques. In such embodiments, data storage system 120 may optionally include one or more on-board capacitors 132 that automatically supplies power to data storage system 120 in the event of a power failure. Data storage system 120 may consequently serve as a non-volatile memory system, even though it utilizes various volatile components.

NAND flash memory array 140 may take many forms in various embodiments. Referring now to FIGS. 2-5, there is depicted one exemplary arrangement of physical memory within a NAND flash memory array 140 in accordance with the present disclosure.

Figure 2:
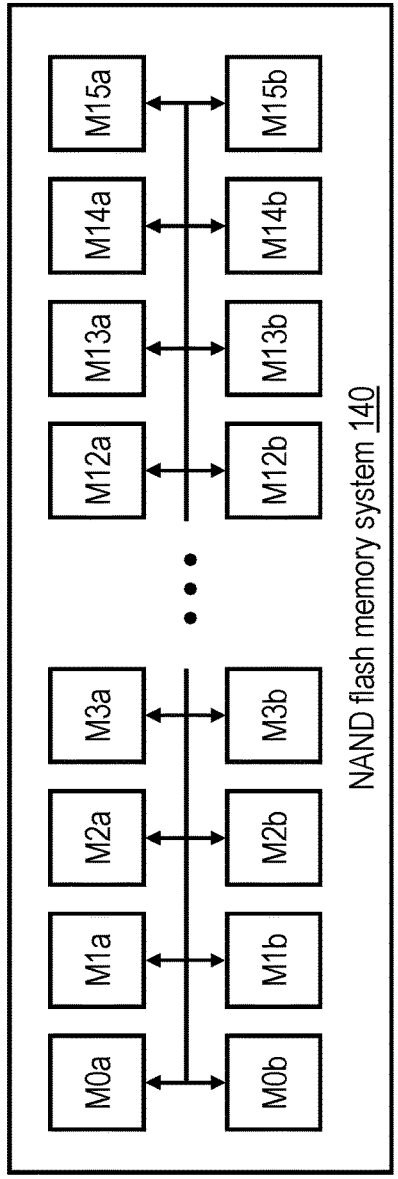
FIGS. 2-5 illustrate an exemplary arrangement of physical memory within a NAND flash memory array in accordance with the present disclosure.

As shown in FIG. 2, NAND flash memory array 140 may be formed from thirty-two (32) individually addressable NAND flash memory storage devices. In the illustrated example, each of the flash memory storage devices M0*a*-M15*b* takes the form of a board-mounted flash memory module, for example, a Single Level Cell (SLC) or Multi-Level Cell (MLC) NAND flash memory module. The thirty-two NAND flash memory modules are arranged in sixteen groups of two (M0*a*, M0*b*) through (M15*a*, M15*b*). For purposes of the physical addressing scheme, each group of two modules forms a "lane," also sometimes referred to as a "channel," such that NAND flash memory array 140 includes sixteen channels or lanes (Lane0-Lane15).

In a preferred embodiment, each of the individual lanes has a respective associated bus coupling it to flash controller 124. Thus, by directing its communications to one of the specific communication buses, flash controller 124 can direct its communications to one of the lanes of memory modules. Because each communication bus for a given lane is independent of the communication buses for the other lanes, flash controller 124 can issue commands and send or receive data across the various communication buses at the same time, enabling flash controller 124 to access the memory modules corresponding to the individual lanes at, or very nearly at, the same time.

Figure 3:
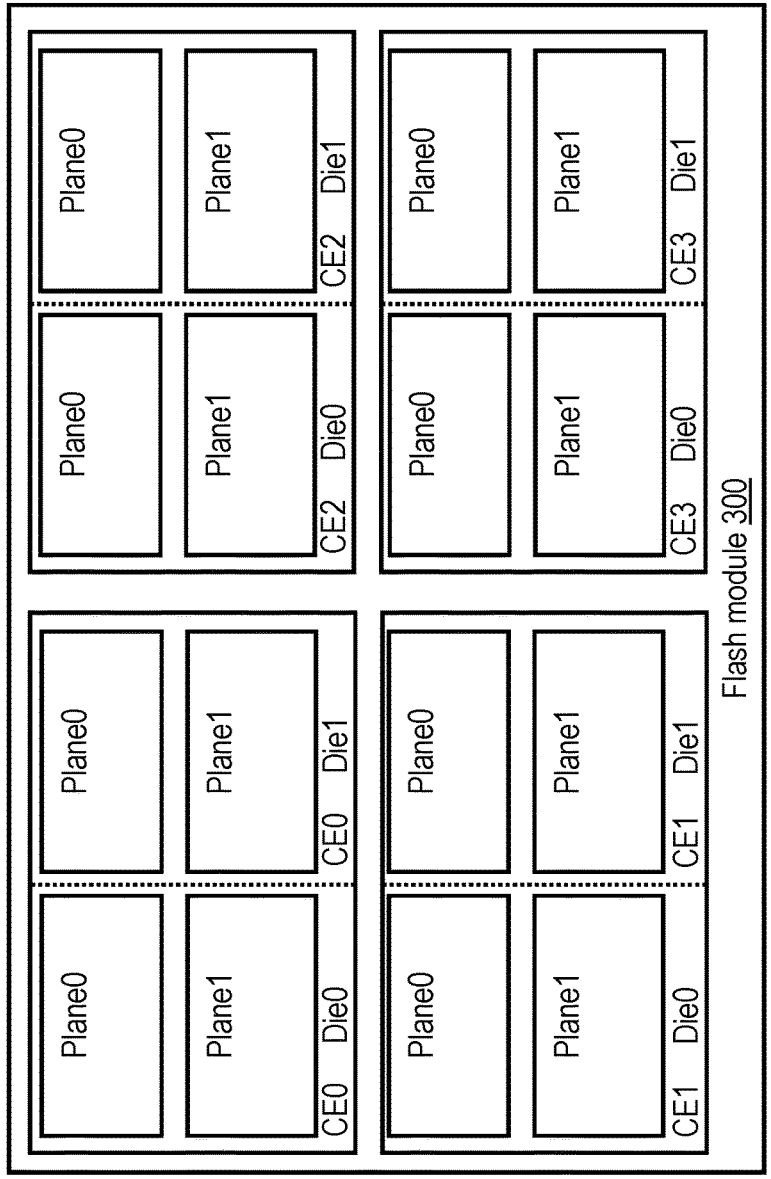

With reference now to FIG. 3, there is illustrated an exemplary embodiment of a flash memory module 300 that can be utilized to implement any of flash memory modules M0*a*-M15*b* of FIG. 2. As shown in FIG. 3, the physical storage locations provided by flash memory module 300 are further subdivided into physical locations that can be addressed and/or identified through Chip Enables (CEs). In the example of FIG. 3, the physical memory of each flash memory chip 300 is divided into four Chip Enables (CE0, CE1, CE2 and CE3), each having a respective CE line that is asserted by flash memory controller 124 to enable access to or from the physical memory locations within the corresponding CE. Each CE is in turn subdivided into multiple dice (Die0 and Die1) each having two planes (Plane0 and Plane1). Each plane represents a collection of blocks (described below) that, because of the physical layout of the flash memory chips, are physically associated with one another and that utilize common circuitry (e.g., I/O buffers) for the performance of various operations, such as read and write operations.

Figure 4:
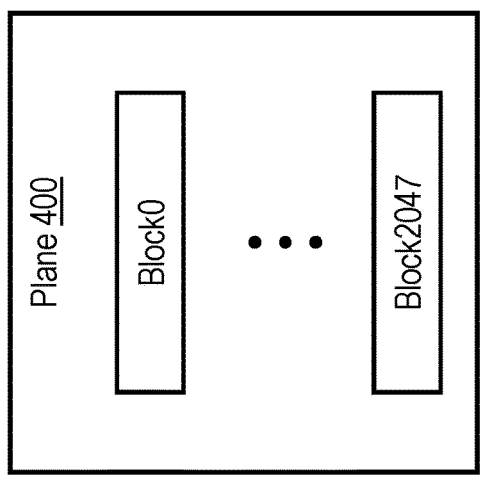
Figure 5:
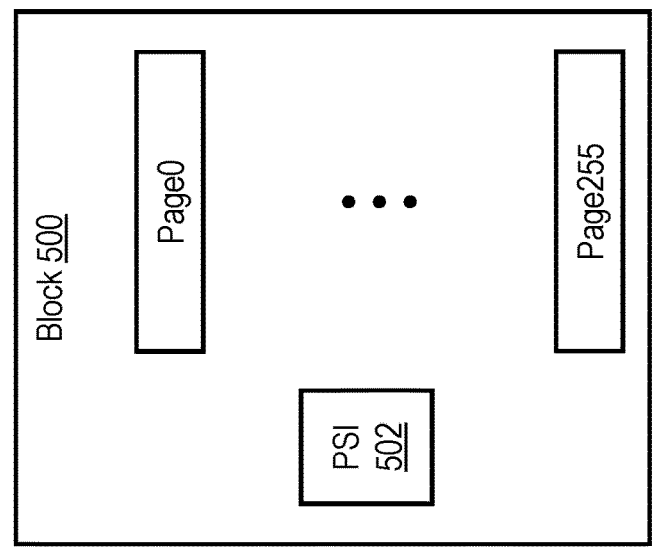

As further shown in FIGS. 4-5, an exemplary plane 400, which can be utilized to implement any of the planes within flash memory module 300 of FIG. 3, includes 2048 blocks of physical memory. In general, a block 500 is a collection of physical pages that are associated with one another, typically in a physical manner. This association is such that a block is defined to be the smallest granularity of physical storage locations that can be erased within NAND flash memory array 140. In the embodiment of FIG. 5, each block 500 includes 256 physical pages, where a physical page is defined to be the smallest individually addressable data unit for read and write access. In the exemplary system, each physical page of data has a common capacity (e.g., 16 kB) for data storage plus additional storage for metadata described in more detail below. Thus, data is written into or read from NAND flash memory array 140 on a page-by-page basis, but erased on a block-by-block basis. As further shown in FIG. 5, each block 500 preferably includes page status information 502, which indicates the status of each physical page in that block 500 as retired (i.e., withdrawn from use) or non-retired (i.e., active or still in use). In various implementations, PSI 502 can be collected into a single data structure (e.g., a vector or table) within block 500, distributed within block 500 (e.g., as one or more bits of metadata appended to each physical page) or maintained elsewhere in data storage system 120 (e.g., in a data structure in flash controller memory 126).

As noted above, data storage system 120 does not generally allow external devices to directly address and/or access the physical memory locations within NAND flash memory array 140. Instead, data storage system 120 is generally configured to present a single contiguous logical address space to the external devices, thus allowing host devices to read and write data to and from LBAs within the logical address space while permitting flash controller 124 and CPU 128 to control where the data that is associated with the various LBAs actually resides in the physical memory locations comprising NAND flash memory array 140. In this manner, performance and longevity of NAND flash memory array 140 can be intelligently managed and optimized.

As writes occur to data storage system 120, it will be necessary for the flash controller 124 and CPU 128 to invalidate the data stored in one of the physical pages of one of the erase blocks in the NAND flash memory array 140. The new data will then be coalesced with data being written and eventually stored in different location in NAND flash memory array 140. It can be seen then that pages or portions of pages will be invalidated and therefore portions of the NAND Flash memory array 140 become unused. Flash controller 124 and CPU 128 will eventually need to reclaim this space through a process called Garbage Collection. Particular erase blocks will be chosen based on a number of factors including how much of the data within the erase blocks is invalid. Valid data will be read and written along with new writes from the host into new erase blocks.

Because the flash translation layer implemented by data storage system 120 isolates the logical address space made available to host devices from the physical memory within NAND flash memory array 140, the size of NAND flash memory array 140 need not be equal to the size of the logical address space presented to host devices. In most embodiments it is beneficial to present a logical address space that is less than the total available physical memory (i.e., to over-provision NAND flash memory array 140). Over-provisioning in this manner ensures that physical memory resources are available when the logical address space is fully utilized, even given the presence of a certain amount of invalid data as described above. In addition to invalid data that has not yet been reclaimed the overprovisioned space can be used to ensure there is enough logical space even given the presence of memory failures and the memory overhead entailed by the use of data protection schemes, such as Error Correcting Code (ECC), Cycle Redundancy Check (CRC), and parity.

In a preferred embodiment, data is typically written to groups of associated physical pages of NAND flash memory array 140 referred to herein as "page stripes." While the lengths of the various page stripes stored into NAND flash memory array 140 can and preferably do vary, in one embodiment each page stripe includes two to fifteen data pages of write data (typically provided by a host device) and one additional page (a "data protection page") used to store data protection information for the write data. For example, FIG. 6 illustrates an exemplary page stripe 600 including N data pages (i.e., Dpage00 through DpageN−1) and one data protection page (i.e., PpageN).

FIG. 7 illustrates an exemplary format of each data page within the page stripe 700. In this example, data page 700 includes a 16 kB data field 702, as well as additional fields for metadata describing the data page. In the illustrated example, these metadata fields include an LBA field 704 containing the LBA of data page 700, a CRC field 706 containing the CRC value computed for the combination of data field 702 and LBA field 704, and an ECC field 708 containing an ECC value calculated, in the illustrated example, from a combination of contents of data field 702, LBA field 704 and CRC field 706.

FIG. 8 depicts an exemplary format of the data protection page of page stripe 800. In the depicted example, data protection page 800 includes a data XOR field 802 that contains the bit-by-bit Exclusive Or (XOR) of the contents of the data fields 702 of the data pages 700 in page stripe 600. Data protection page 800 further includes an LBA XOR field 804 that contains the bit-by-bit XOR of the LBA fields 704 of the data pages 700 in page stripe 600. Data protection page 800 finally includes a CRC field 806 and ECC field 808 for respectively storing a CRC value and an ECC value for data protection page 800. Such a protection scheme is commonly referred to as RAID 5, since the parity field will not always be located on one particular flash plane. However, it should be appreciated that alternate data protection schemes such as Reed-Solomon can be used.

The formats for data pages and data protection pages described above protect data stored in a page stripe using multiple different protection mechanisms. First, the use of the ECC bits in each data page allows the correction of some number of bit errors within the flash page. Depending on the ECC method used it may be possible correct hundreds of bits or even thousands of bits within a NAND flash page. After ECC checking and correction is performed, the corrected CRC field is used to validate the corrected data. Used together, these two mechanisms allow for the correction of relatively benign errors and the detection of more serious errors using only local intra-page information. Should an uncorrectable error occur in a data page, for example, due to failure of the physical page utilized to store the data page, the contents of the data field and LBA field of the failing data page may be reconstructed from the other data pages and the data protection page for the page stripe.

While the physical memory locations in which the data pages and data protection page of a page stripe will vary within NAND flash memory array 140, in one embodiment the data pages and data protection page that comprise a given page stripe are preferably stored in physical memory locations selected to optimize the overall operation of the data storage system 120. For example, in some embodiments, the data pages and data protection page comprising a page stripe are stored such that different physical lanes are employed to store each of the data page and data protection page. Such embodiments support efficient access to a page stripe because flash controller 124 can access all of the pages of data that comprise the page stripe simultaneously or nearly simultaneously. It should be noted that the assignment of pages to lanes need not be sequential (i.e., data pages can be stored in any lane in any order), and unless a page stripe is a full length page stripe (e.g., containing fifteen data pages and one data protection page), the lanes utilized to store the page stripe need not be adjacent.

Having described the general physical structure of the data storage system 120 and aspects of the manner in which data in the form of page stripes are addressed and stored within NAND flash memory array 140, certain operational aspects of data storage system 120 are now described, including aspects relating to reading and writing data from and to NAND flash memory array 140.

Figure 9:
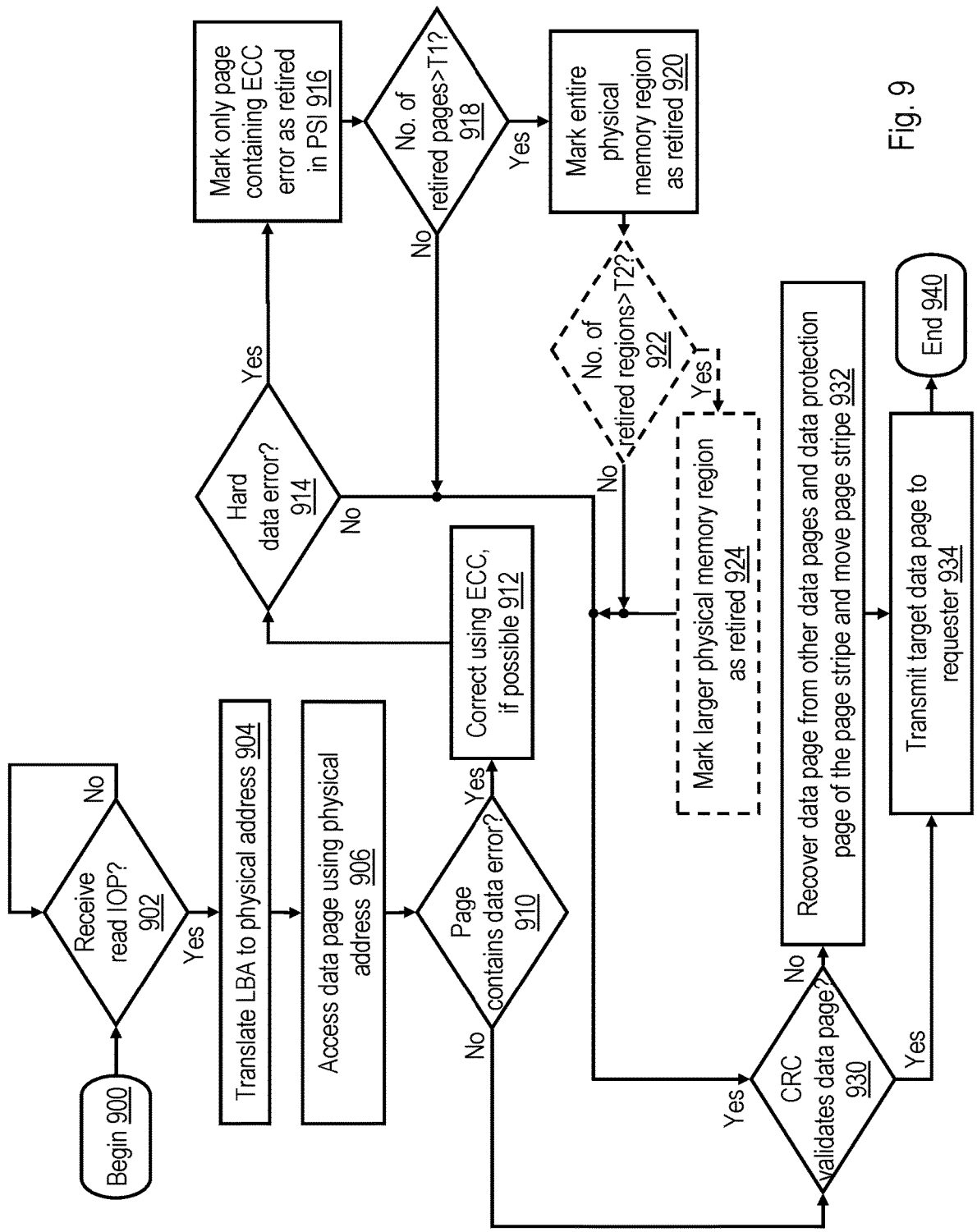
FIG. 9 is a high level logical flowchart of an exemplary embodiment of a data read process in which physical memory in a NAND flash memory array is retired on a page-by-page basis rather than on a block-by-block basis.

With reference now to FIG. 9, there is illustrated a high level logical flowchart of an exemplary method of performing a read operation in data storage system 120 in which physical memory may be retired on a page basis. The method may be performed, for example, by flash controller 124 and/or CPU 128 in hardware, firmware, software or a combination thereof. For simplicity of explanation, it will hereafter be assumed that the process is performed by flash controller 124. As with the other flowcharts provided herein, steps are presented in logical rather than strictly chronological order, and in some embodiments at least some of the steps may be performed in an alternative order or concurrently.

The illustrated process begins at block 900 and then proceeds to block 902, which illustrates flash controller 124 awaiting receipt of a read IOP from an external host device, such as processor system 102. In general, the read IOP will specify the LBA of a target data page that is requested by the host device. In response to receipt of the read IOP, flash controller 124 translates the LBA (e.g., by reference to logical-to-physical translation table (TT) 150 in flash controller memory 126) to determine the physical address of the physical page that stores the requested data page (block 904). Once the physical address is determined, flash controller 124 accesses the target data page utilizing the physical address by issuing a read request to read the target data page from the physical page associated with the physical address (block 906). The read IOP may request various sizes of data, but for simplification it is assumed that the flow diagram 900 will be exercised once for each logical page referenced by the read IOP.

At block 910, flash controller 124 computes the ECC for the data page and compares the computed ECC with the ECC contents of ECC field 708 to determine whether or not the data page contains a data error. Such data errors can be due to any number of problems, including trapped charge in the oxide layer of the physical device or charge that has leaked from the floating gate. These errors may be permanent in nature such that the cell is no longer capable of storing and reading data correctly or the errors may be due to issues related to data retention or electrical noise inflicted by writes or reads of adjacent cells. Such errors will not be present when the cell is erased and then rewritten. True soft errors are substantially random and are typically not uniquely associated with any specific physical pages, blocks or other physical regions of NAND flash memory array 140. A hard error, on the other hand, is a corruption of one or multiple bits of data caused by a physical failure. Hard errors can be caused by a variety of factors including, but not limited to, the physical failure of one or more components within a given memory chip (such as the failure of a charge pump), the physical failure of an entire memory chip or the external support structures for that chip (e.g., the breaking of a power line or an address line to a chip), the physical failure of all or part of a chip as a result of environmental factors (e.g., excessive temperature, magnetic field, humidity, etc). In general, because hard errors arise from the physical structure of the memory system, hard errors are uniquely associated with a particular collection of memory chips, a particular memory chip, or specific physical regions within a chip (such as a CE, plane, block or page).

In response to a determination at block 910 that the data page does not contain a data error, the process passes to block 930, which is described below. However, in response to a determination at block 910 that the data page contains a data error, flash controller 124 corrects the error in the data page utilizing the ECC, if possible (e.g., if there are 50 bits in error within the codeword and the ECC is capable of correcting greater than 50 bits in error within the code word.). At block 914, flash controller 124 determines whether or not the detected data error is a hard error. Flash controller 124 can infer that a data error is a hard error, for example, based on a frequency or number of data errors from a given physical memory region. In other words, flash controller 124 may notice that all physical pages within a given erase block have failed. In response to a determination at block 914 that the data error is a correctable error, the process proceeds to block 930, which is described below. If, on the other hand, flash controller 124 determines that the data error is an uncorrectable error, the process passes to block 916.

At block 916, flash controller 124 marks only the physical page that stores the target data page as retired (i.e., no longer available for allocation to store a data page of a new page stripe), for example, in the PSI 502 of the block containing that physical page. Thus, in contrast to prior art systems that retire physical memory in a NAND flash memory on a block-by-block basis, data storage system 120 retires physical memory in NAND flash memory array 140 on a page-by-page basis in response to detection of a single data error. As will be appreciated, retirement of a physical page of physical memory (e.g., 16 kB) rather than a block (e.g., 4 MB) conserves physical memory resources, enhancing the performance and extending the life of NAND flash memory array 140. However, as a consequence of page retirement, the effective sizes of blocks of physical memory of NAND flash memory system 140 will vary, as described further below.

This exemplary implementation waits until a physical page has one or more codewords containing uncorrectable errors before performing the retirement. However, certain implementations may choose to retire a page at some point prior to uncorrectability. For example, if an implementation uses BCH ECC over approximately 1024 bytes and can correct 50 bits in error, flash controller 124 may decide to retire a page when the number of uncorrectable bits reaches a number less than 50, say 48. Additionally, one skilled in the art will also know that, depending on the flash technology used, that flash controller 124 may elect to perform additional steps at block 914 before retiring the page. For example, the flash manufacturer may require flash controller 124 to change certain parameters for that page or block and perform a re read of the page. If the data is now correctable, then flash controller 124 would follow the No path from block 914. In this way, block 914 may contain many additional steps not described herein in determining that the page contains a hard error or truly uncorrectable error.

At block 918, flash controller 124 further determines by reference to PSI 502 whether or not the number of retired pages of physical memory in a physical memory region containing the page retired at block 916 now satisfies (e.g., is greater than and/or equal to) a first threshold T1. In at least some embodiments, the first threshold T1 is configurable. Performance testing has shown that performance of data storage system 120 is optimized if the first threshold T1 is less than about 10% of the physical pages in the physical memory region and, more particularly, is configured to be about 5% of the physical pages in the physical memory region. Still more particularly, it is preferable if the first threshold T1 is configured to be about 4% of the physical pages in the physical memory region. These numbers are exemplary only and can vary dramatically based on the use and requirements of the data storage system. The physical memory region to which the first threshold T1 pertains can be, for example, a block, plane, die, CE or entire flash module.

In response to flash controller 124 determining at block 918 that the first threshold is not satisfied, the process passes to block 930. However, in response to flash controller 124 determining at block 918 that the first threshold is satisfied, flash controller 124 marks the entire physical memory region containing the retired physical page as retired and thus unavailable for allocation to store new page stripes (block 920). If the physical memory region for which retirement is determined at block 918-920 is a smaller region than an entire flash memory module, flash controller 124 may optionally determine whether or not to retire larger physical memory regions containing the retired physical page, as shown at optional blocks 922-924. As indicated, the additional determination regarding retirement of larger physical memory regions can be based on a comparison of the number of retired physical memory regions (e.g., pages, blocks, planes, dies or CEs) within the larger physical memory region and a second threshold T2 (which may differ from threshold T1). The process proceeds from either block 920 or one of blocks 922 and 924 to block 930. It may also be determined that there are now too many retired memory resources within NAND flash memory system 140 to be able to achieve required performance levels, and flash controller 124 may send a response to the user indicating that it is time to replace the physical resource containing NAND flash memory system 140.

At block 930, flash controller 124 attempts to validate the data field 702 and LBA field 704 of the target data page by computing a cyclic redundancy code and comparing the computed CRC to that contained in CRC field 706. In response to successful validation of the data page, the process proceeds to block 934, which is described below. However, in response to failure of the CRC validation, flash controller 124 reads the entire page stripe and recovers the correct content of the target data page from the other data page(s) and the data protection page of the page stripe (block 932). In addition, flash controller 124 moves the page stripe (including the recovered target data page) to a different physical location in NAND flash memory system 120, for example, utilizing the method depicted in FIG. 10, which is described below. From block 930 or block 932, the process proceeds to block 934, which illustrates flash controller 124 transmitting the target data page to the requesting host device. Thereafter, the process of FIG. 9 terminates at block 940. The method of FIG. 9 may again be performed at some later unspecified time depending on other operations in process.

As noted above, the order of operations set forth in FIG. 9 is exemplary and embodiments are envisioned where the order of operations is different from that set out above. For example, embodiments are envisioned in which flash controller 124 transmits the data page to the host device prior to completing CRC validation and thereafter transmits an indication of whether the data page is valid or not. Also in some embodiments, the read TOP may access multiple data pages rather than a single data page.

Figure 10:
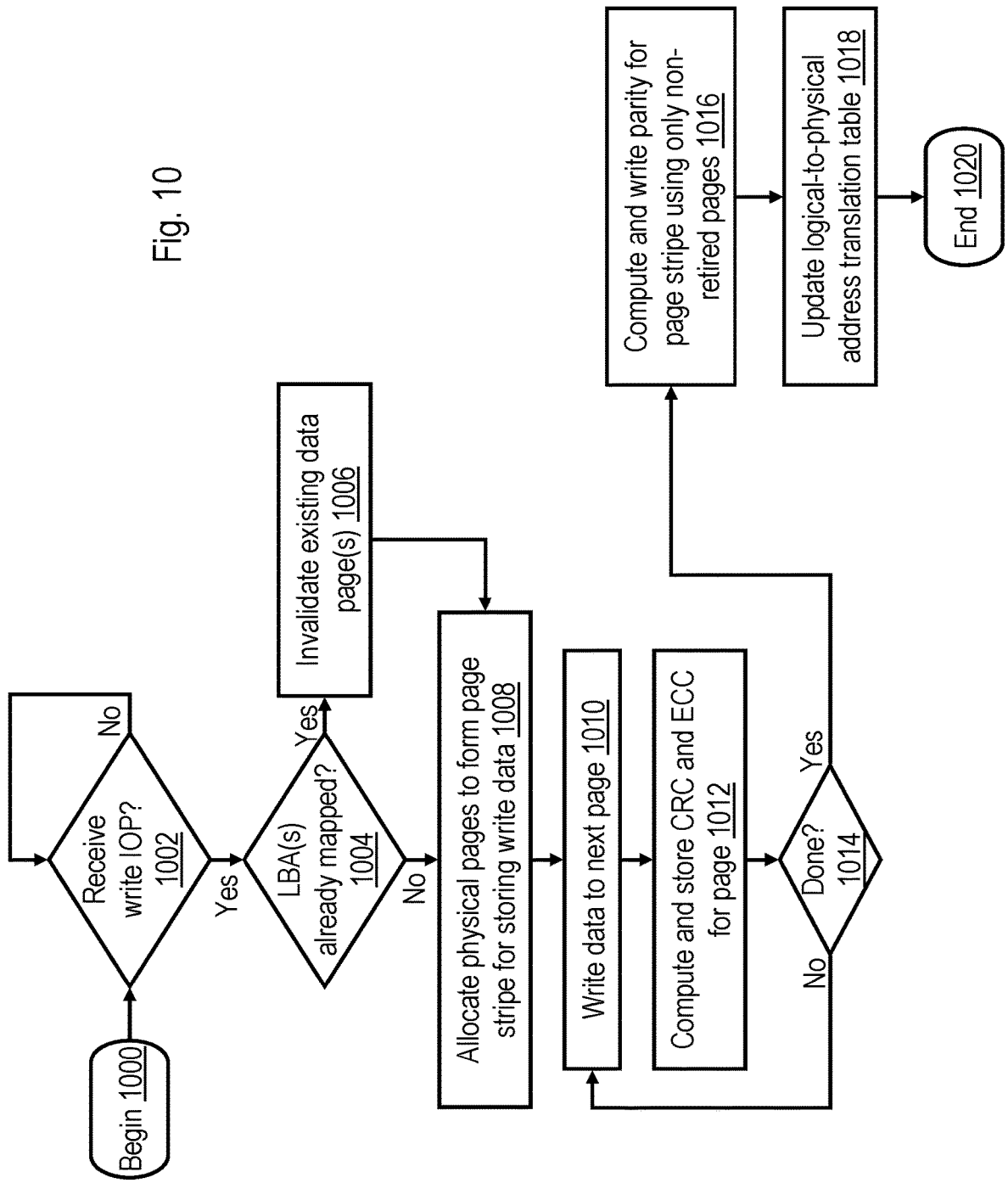
FIG. 10 is a high level logical flowchart of an exemplary embodiment of a data write process by which data is written to a NAND flash memory array in a variable length page stripe across variable sized data blocks.

With reference now to FIG. 10, there is illustrated a high level logical flowchart of an exemplary method of performing a write operation in data storage system 120. The method may be performed, for example, by flash controller 124 and/or CPU 128 in hardware, firmware, software or a combination thereof. For simplicity of explanation, it will hereafter be assumed that the process is performed by flash controller 124.

The method begins at block 1000 and then proceeds to block 1002, which illustrates flash controller 124 awaiting receipt of a write TOP from a host device, such as processor system 102. The write TOP includes, for example, a data to be written into NAND flash memory array 140 and an indication of the target LBA(s) at which the host device would like for the data to be stored. In response to receipt of a write TOP, the process proceeds from block 1002 to blocks 1004-1106, which illustrates flash controller 124 determining (e.g., by reference to logical-to-physical address translation table 150) whether the target LBA(s) indicated in the write TOP is/are currently mapped to physical memory page(s) and, if so, changing the status of each data page currently associated with a target LBA to indicate that it is no longer valid. As is known in the art, invalidated pages (and the blocks containing them) will eventually be erased and again made available for allocation to store data by a garbage collection process of flash controller 124.

At block 1008, flash controller 124 allocates physical pages to form a page stripe to store the write data. As noted above, flash controller 124 preferably selects each of the physical pages allocated to store write data from a different block in a different lane. Further, in allocating the physical pages to store the page stripe, flash controller 124 excludes from consideration any retired pages, as indicated by the PSIs 502. As indicated at block 1010, flash controller 124 then begins to store the first data page of the write data to the first physical page allocated to the page stripe. At block 1012, flash controller 124 additionally computes the CRC and ECC values for the data page and stores that those value into the CRC field 706 and ECC field 708 of the data page. As indicated by block 1014, flash controller 124 determines whether all of the write data has been written into NAND flash memory system 140. If flash controller 124 determines that less than all of the write data has been written to NAND flash memory system 140, the process returns to block 1010, which has been described. In response to a determination that all of the write data has been stored in NAND flash memory system 140, flash controller 124 computes parity information for the page stripe (e.g., by performing a bit-by-bit XOR of all the data pages in the page stripe) and stores the parity information in the data protection page of the page stripe (block 1016). Again, any physical pages that are retired that would otherwise be allocated in the data stripe are excluded from the parity computation. Flash controller 124 also updates the logical-to-physical address translation table to associate the physical page(s) utilized to store the write data with the LBA(s) indicated by the host device (block 1018). Thereafter, the process ends at block 1020.

It should be noted that blocks 1008, 1010 and 1012 will include steps that check whether or not the programming of that physical page completes correctly. If flash controller 124 determines that the write did not complete correctly, then flash controller 124 will employ various recovery techniques, such as retrying the write operation. If the write eventually passes, then flash controller 124 will continue to the next block. However, if the write is unsuccessful, then flash controller 124 will retire that page in the same manner as when a read is unsuccessful. Having retired that page, flash controller 124 will change its tables accordingly and proceed to the next non-retired page to complete either blocks 1008,1010 or 1012.

Figure 11:
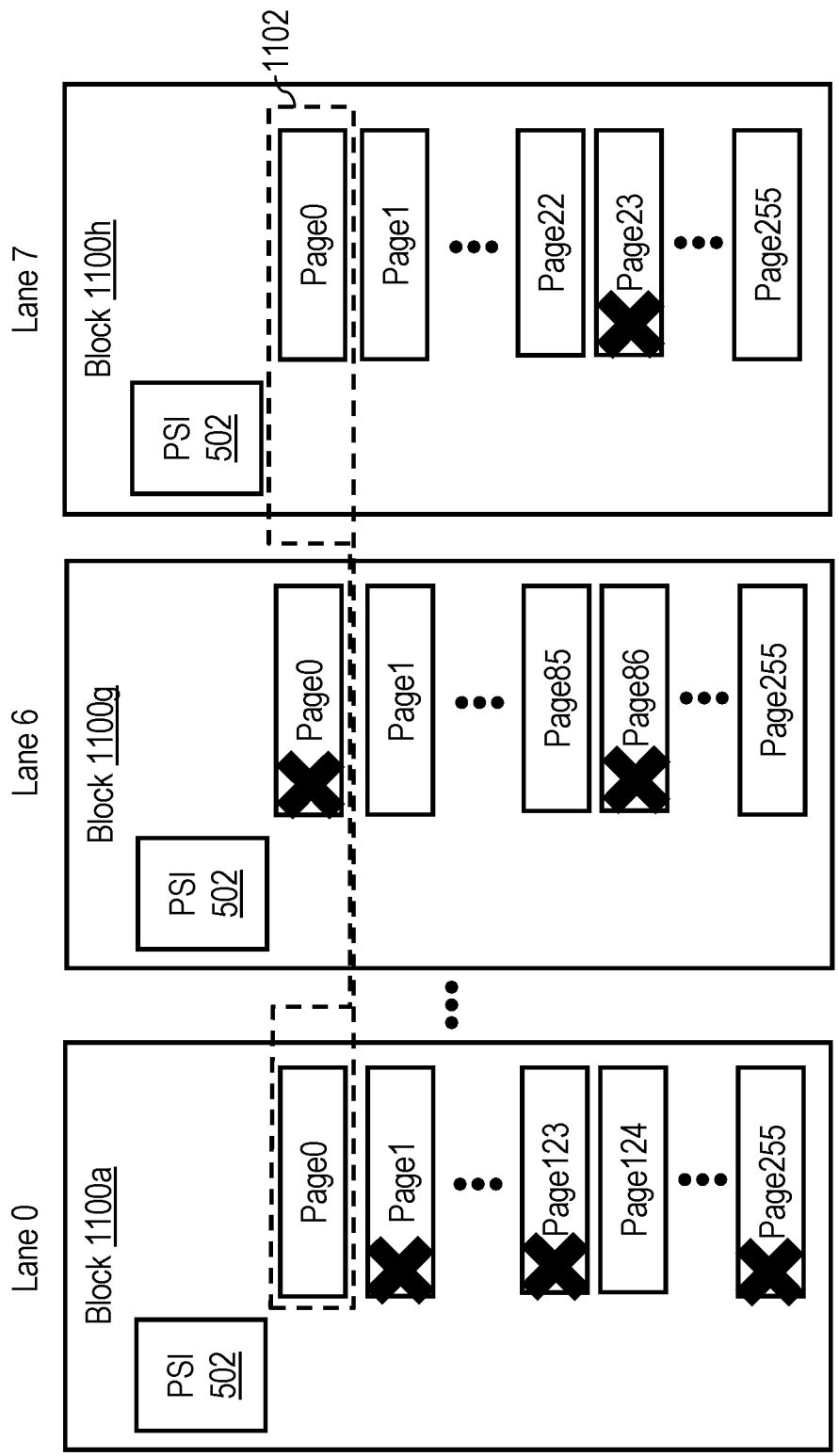
FIG. 11 illustrates an exemplary page stripe in a NAND flash memory array in which physical memory is retired on a page-by-page basis.

With reference now to FIG. 11, there is illustrated an exemplary page stripe 1102 written to NAND flash memory system 140 in accordance with the method of FIG. 10. As noted above, page stripes written to NAND flash memory system 140 can vary in length between two and fifteen data pages plus one data protection page. However, in the illustrated example, flash controller 124 has written a page stripe including six data pages and one data protection page. In this example, flash controller 124 has selected the physical pages for storing the page stripe from a pool of blocks including blocks 1100a-1100h in lanes 0-7, respectively. In each of blocks 1100a-1100h, one or more pages have been retired, as graphically indicated in FIG. 11 by an "X" and as recorded by flash controller 124 in PSI 502. Thus, for example, Page1, Page123 and Page255 of block 1100a are retired; Page1 and Page86 of block 1100g are retired; and Page23 of block 1100h is retired.

In flash memory, it is beneficial to write data into blocks sequentially by page in some order determined by the flash manufacturer. Thus, when writing to a block of NAND flash memory system 140, it may be desirable and beneficial to write first to Page1, then to Page1 and so on until the block is full, or nearly full, of stored data. In some implementations it may be desirable to write in some order other than Page1, Page1, etc., but the end result is still a sequential processing of pages in some order for the entire block. In the embodiment of FIG. 11, this form of writing data into NAND flash memory 140 is accomplished by having flash controller 124 maintain a count so that the first page stripe written into a given group of blocks is written across Page1 of the blocks within the group of blocks, the next page stripe is written across Page1 of the blocks within the group of blocks, and so on. It should be noted, however, that any retired pages, such as Page1 of block 1100g, are excluded from allocation to a page stripe, such as page stripe 1102. Similarly, when the next page stripe is written to the group of blocks, Page1 of block 1100a will not be used.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As has been described, in some embodiments of a data storage system including a NAND flash memory array, a page is a smallest granularity of the NAND flash memory array that can be accessed by read and write operations, and a memory block containing multiple pages is a smallest granularity of the NAND flash memory array that can be erased. Data are stored in the NAND flash memory array in page stripes distributed across multiple memory blocks. In response to detection of an error in a particular page of a particular block of the NAND flash memory array, only the particular page of the particular block is retired, such that at least two of the multiple memory blocks across which a particular one of the page stripes is distributed include differing numbers of active (non-retired) pages.

While the present invention has been particularly shown as described with reference to one or more preferred embodiments, it will be understood by those skilled in the art that various changes in form and detail may be made therein without departing from the spirit and scope of the invention. For example, although aspects have been described with respect to a data storage system including a flash controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude transitory propagating media per se.

In addition, although embodiments have been described that include use of a NAND flash memory, it should be appreciated that the inventions herein are not limited to use with NAND flash memory, but are instead applicable to any other non-volatile random access memory (NVRAM) technology that may define erase blocks that are larger than physical pages. For example, the disclosed techniques may be applied to phase-change memory (PCM), magnetoresistive RAM (MRAM) and resistive RAM (RRAM).

The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a," is not intended as limiting of the number of items.

What is claimed is:

1. A method of page retirement in a data storage system including a non-volatile random access memory (NVRAM) array, the method comprising:

storing data in the NVRAM array in page stripes distributed across multiple memory blocks, wherein at least two of the multiple memory blocks across which one of the page stripes is distributed include differing numbers of active physical pages, wherein at least two of the multiple page stripes are distributed across differing numbers of blocks, and wherein a physical page is a smallest granularity that can be accessed in the NVRAM array and a memory block containing multiple physical pages is a smallest granularity that can be erased in the NVRAM array;

detecting an error in a particular physical page of a particular block of the NVRAM array by the detecting a mismatch between a code computed for the particular physical page and a code stored in the NVRAM array in association with the particular physical page;

in response to detection of the error, retiring only the particular physical page of the particular block in which the error occurred and recording retirement of the particular physical page in a page status data structure; and thereafter, allocating a plurality of page stripes across a group of memory blocks including the particular block such that each of the plurality of page stripes is formed at a respective one of a plurality of different physical page indices, wherein the allocating includes skipping the particular page in the particular block when allocating a first page stripe at a first physical page index based on the page status data structure indicating the particular page as retired, and skipping another page in another block within the group of memory blocks when allocating a second page stripe at a second physical page index based on the page status data structure indicating said another page as retired.

2. The method of claim 1, and further comprising:

thereafter, retiring a physical memory region in the NVRAM array containing the particular physical page and multiple other physical pages in response to retirement of a threshold number of physical pages within the physical memory region.

3. The method of claim 2, wherein the physical memory region comprises the particular block.

* * * * *